United States Patent
Jin et al.

(10) Patent No.: US 12,051,994 B2
(45) Date of Patent: Jul. 30, 2024

(54) FLIGHT VEHICLE COMPRISING A WING WITH DOUBLE-SIDE GENERATION TYPE SOLAR CELLS

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Haiyan Jin, Kawasaki Kanagawa (JP); Takeshi Gotanda, Yokohama Kanagawa (JP); Yutaka Saita, Yokohama Kanagawa (JP); Tomohiro Tobari, Yokohama Kanagawa (JP); Katsuya Yamashita, Kawasaki Kanagawa (JP); Miyuki Shiokawa, Kawasaki Kanagawa (JP); Kenji Fujinaga, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Tokyo (JP)

( * ) Notice: Subject to any disclaimer, the term of this patent is extended or adjusted under 35 U.S.C. 154(b) by 194 days.

(21) Appl. No.: 17/578,519

(22) Filed: Jan. 19, 2022

(65) Prior Publication Data
US 2022/0140780 A1 May 5, 2022

Related U.S. Application Data

(63) Continuation of application No. PCT/JP2019/029372, filed on Jul. 26, 2019.

(51) Int. Cl.
*H02S 40/22* (2014.01)
*B64C 3/26* (2006.01)
(Continued)

(52) U.S. Cl.
CPC ............. *H02S 40/22* (2014.12); *B64C 3/26* (2013.01); *G02B 5/0284* (2013.01); *H02S 10/40* (2014.12)

(58) Field of Classification Search
CPC .......... H02S 40/22; H02S 10/40; B64C 3/26; B64D 2211/00; G02B 5/0284
(Continued)

(56) References Cited

U.S. PATENT DOCUMENTS

| 5,810,284 A | 9/1998 | Hibbs et al. |
| 6,540,178 B1 | 4/2003 | Hillsdon |

(Continued)

FOREIGN PATENT DOCUMENTS

| CN | 102582837 | 7/2012 |
| JP | 04-005198 | 1/1992 |

(Continued)

OTHER PUBLICATIONS

International Search Report and Written Opinion for International Application No. PCT/JP2019/029372 mailed on Aug. 27, 2019, 9 pgs.

*Primary Examiner* — Brady W Frazier
*Assistant Examiner* — Shanna Danielle Glover
(74) *Attorney, Agent, or Firm* — Amin, Turocy & Watson, LLP

(57) ABSTRACT

A flight vehicle of an embodiment includes a wing, double-side generation type solar cells, and a light reflecting part. The wing has an outer shell member. The outer shell member has transmittance. The wing is formed by an outer shell member in a hollow shape. The solar cells are disposed on the upper surface of the wing. The light reflecting part is provided on an inner surface of the outer shell member.

11 Claims, 4 Drawing Sheets

(51) Int. Cl.
  *G02B 5/02* (2006.01)
  *H02S 10/40* (2014.01)
(58) Field of Classification Search
  USPC ........................................................ 136/246
  See application file for complete search history.

(56) References Cited

U.S. PATENT DOCUMENTS

| | | | |
|---|---|---|---|
| 7,898,789 B1 * | 3/2011 | Jarvinen | ................ B64D 27/24 |
| | | | 361/218 |
| 8,469,313 B2 | 6/2013 | Dong | |
| 2013/0126668 A1 | 5/2013 | Chessel et al. | |
| 2014/0055876 A1 | 2/2014 | Choi | |
| 2015/0256123 A1 | 9/2015 | Ahn | |
| 2016/0301359 A1 | 10/2016 | Gerritsen et al. | |
| 2018/0219117 A1 | 8/2018 | Colosimo et al. | |

FOREIGN PATENT DOCUMENTS

| | | | | |
|---|---|---|---|---|
| JP | | 2629090 | 7/1997 | |
| JP | | 2000-280988 | 10/2000 | |
| JP | | 3101388 | 10/2000 | |
| JP | | 2005-150563 | 6/2005 | |
| JP | | 2006-128329 | 5/2006 | |
| JP | | 4719842 | 7/2011 | |
| JP | | 2013-107638 | 6/2013 | |
| JP | | 2015-026666 | 2/2015 | |
| JP | | 5792896 | 10/2015 | |
| JP | | 2016-505437 | 2/2016 | |
| JP | | 2017-501673 | 1/2017 | |
| JP | | 6105290 | 3/2017 | |
| JP | | 2018-170424 | 11/2018 | |
| WO | WO-2017200487 A1 * | | 11/2017 | ........... H01L 31/048 |
| WO | WO-2019064032 A1 * | | 4/2019 | |

* cited by examiner

FLIGHT VEHICLE COMPRISING A WING WITH DOUBLE-SIDE GENERATION TYPE SOLAR CELLS

CROSS-REFERENCE TO RELATED APPLICATION

This is a Continuation Application of International Application No. PCT/JP2019/029372, filed on Jul. 26, 2019, and the entire contents of the aforementioned application are incorporated herein by reference.

FIELD

Embodiments described herein relate generally to a flight vehicle.

BACKGROUND

In recent years, as a type of a flight vehicle, a solar plane that uses electric power generated by solar cells as a power source has been developed. The solar plane not only flies while generating electricity during the day but may also perform night flight using charged electric power. In addition, the solar plane requires electric power for various devices other than an electric motor. In this way, while the solar plane needs to generate a large amount of electric power, it is necessary to minimize an increase in weight due to properties of the aircraft. Here, for example, the solar plane includes solar cells disposed on an upper surface of the wing, and is designed to efficiently receive solar light from above.

Incidentally, the solar plane may be premised on being resident in the stratosphere. In this case, in addition to the direct incidence of solar light from above, reflected light in clouds or the like from below is also incident on the solar plane. Here, electric power generation can be improved by mounting solar cells on an upper surface and a lower surface of the solar plane. However, when the solar cells are mounted on each of the upper surface and the lower surface of the solar plane, the weight may be increased in comparison with the configuration in which the solar cells are mounted on only the upper surface.

DETAILED DESCRIPTION

Figure 1:
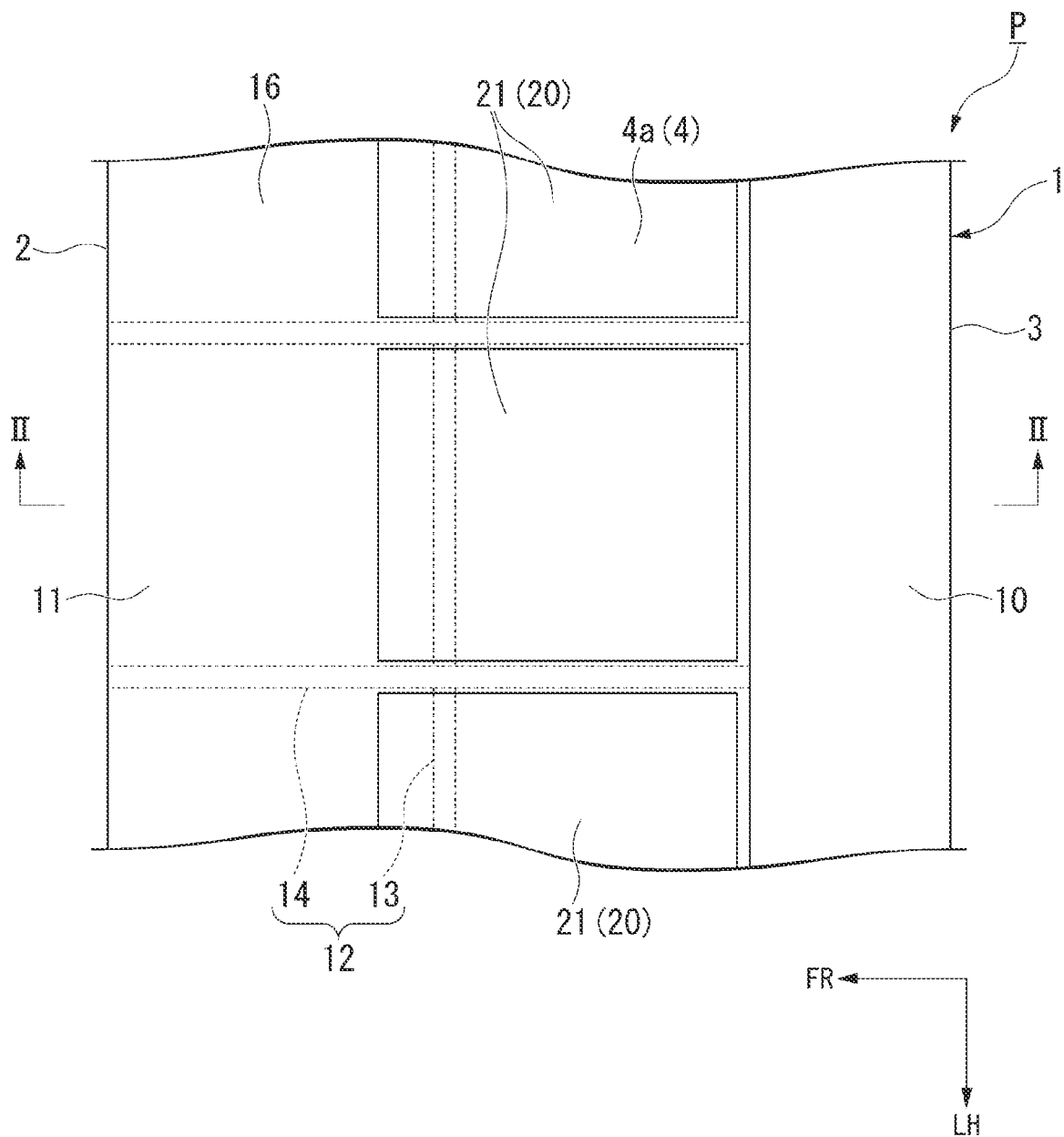
FIG. 1 is a plan view showing a part of a wing of a flight vehicle according to a first embodiment.

A flight vehicle of an embodiment includes a wing, double-side generation type solar cells, and a light reflecting part. The wing has an outer shell member. The outer shell member has transmittance. The wing is formed by an outer shell member in a hollow shape. The solar cells are disposed on the upper surface of the wing. The light reflecting part is provided on an inner surface of the outer shell member. The light reflecting part is provided on a part of the wing inside a lower surface thereof. Light incident from the lower surface of the wing through the outer shell member on the lower surface of the wing in which the light reflecting part is not provided is incident on lower surfaces of the solar cells.

Hereinafter, a flight vehicle of an embodiment will be described with reference to the accompanying drawings. The flight vehicle of the embodiment is a fixed wing aircraft and a solar plane that obtains propulsion power by driving electric motor using electric power generated by solar cells. Further, directions of forward, rearward, upward, downward, leftward and rightward in the following description are the same as the directions of the flight vehicle described below. That is, a forward/rearward direction is a direction along a roll axis of the flight vehicle. An upward/downward direction is a direction along a yaw axis, and a leftward/rightward direction is a direction along a pitch axis. In addition, in the drawings used in the following description, an arrow UP indicates an upward direction, an arrow FR indicates a forward direction, and an arrow LH indicates a leftward direction.

First Embodiment

Figure 2:
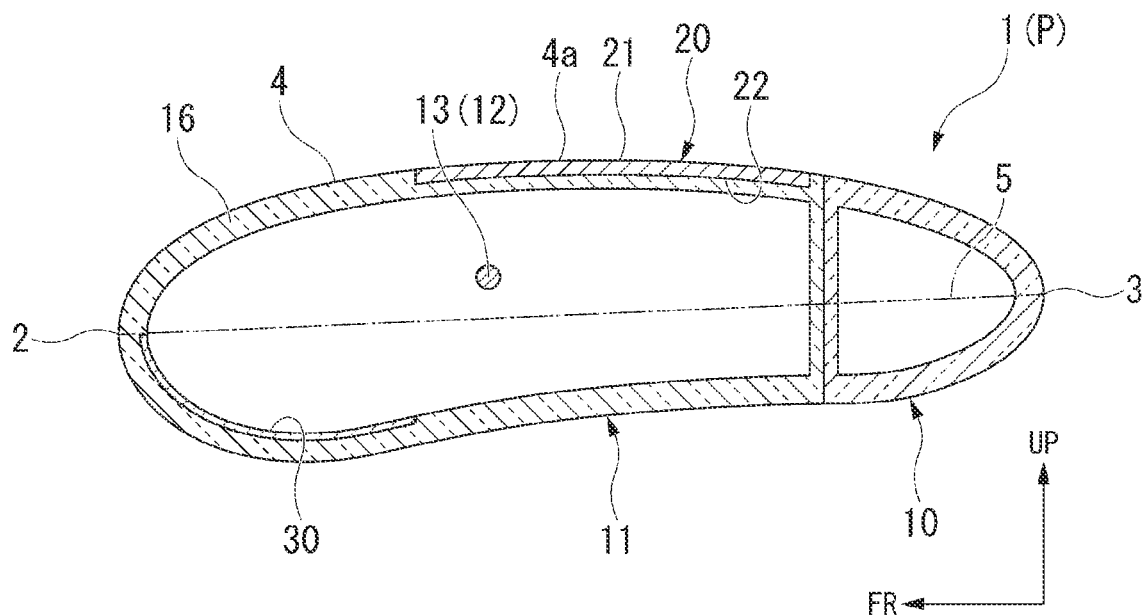
FIG. 2 is a cross-sectional view along line II-II in FIG. 1.

FIG. 1 is a plan view showing a part of a wing of a flight vehicle according to a first embodiment. FIG. 2 is a cross-sectional view along line II-II in FIG. 1.

As shown in FIGS. 1 and 2, a wing 1 of a flight vehicle P is a wing that extends in a forward/rearward direction and a leftward/rightward direction. For example, the wing 1 is a main wing of the flight vehicle P. The wing 1 includes a front edge 2 and a rear edge 3. An upper surface 4 of the wing 1 has a curvature that is reduced from the front edge 2 toward a rear side. Here, a portion of the wing 1 located above a wing chord 5 that connects the front edge 2 and the rear edge 3 is referred to as an upper portion of the wing 1, and a portion located below the wing chord 5 is referred to as a lower portion of the wing 1. In addition, a portion of the upper surface 4 of the wing 1 having a curvature smaller than a predetermined curvature is defined as a flat portion 4a. The flat portion 4a is provided within a range of the upper portion of the wing 1 that does not include at least the front edge 2 of the wing 1. The flat portion 4a is directed above a horizontal direction.

The wing 1 includes a moving blade 10 such as a rear edge flap, an aileron, or the like, on a rear portion. Hereinafter, in the wing 1, a main portion of the wing 1 that supports the moving blade 10 is referred to as a main body portion 11. The main body portion 11 of the wing 1 is formed in a hollow shape. The main body portion 11 of the wing 1 is formed as a semi-monocoque structure, and includes a frame member 12, and an outer shell member 16 configured to cover the frame member 12.

The frame member 12 includes a spar 13 and ribs 14. The spar 13 extends from a tip of the wing 1 toward a central side of the flight vehicle P in the leftward/rightward direction. In the embodiment, one spar 13 is provided, and extends near an intermediate portion of the wing 1 in the forward/rearward direction. The plurality of ribs 14 are disposed at intervals in the leftward/rightward direction. The ribs 14 are formed in a flat plate shape having both main surfaces directed in the leftward/rightward direction. Each of the ribs 14 is coupled to the spar 13. The ribs 14 are disposed to fill a hollow cross section of the wing 1 when seen in the leftward/rightward direction.

The outer shell member 16 form an outer shell of the main body portion 11 of the wing 1. The outer shell member 16 covers the frame member 12, and is coupled to the entire circumference of the outer circumferential edge of each of the ribs 14. The outer shell member 16 is formed of a transparent material having transmittance. As a material that forms the outer shell member 16, for example, silicone rubber, fluorocarbon resin, fluorocarbon rubber, polyvinyl fluoride, polyvinylidene fluoride resin, silicone resin, acrylic rubber, polypropylene, ethylene propylene rubber, urethane, acrylic resin, poly-methyl methacrylate resin, urethane rubber, butyl rubber, natural rubber, nitrile rubber, polyethylene, polyamide resin, nylon, styrene butadiene rubber, vinyl chloride, chloroprene rubber, epoxy, phenol resin, polycarbonate, polystyrene, polyester resin, melamine resin, poly-methyl methacrylate resin, ebonite, or the like, can be used. The outer shell member 16 is capable of transmitting light from an outer surface of the outer shell member 16 toward an inner side of the main body portion 11 of the wing 1. An inner surface of the outer shell member 16 is a smooth surface except for a portion in which a light reflecting part 30 (to be described below) is provided, and minimizes diffuse reflection of light.

The wing 1 further includes solar cells 20 and the light reflecting part 30.

The solar cell 20 is a double-side generation type solar cell panel. For example, the double-side generation type solar cell panel includes a solar cell element that forms a back surface field (BSF) layer on a semiconductor substrate having a p-n junction. The solar cell 20 includes a first light receiving surface 21, and a second light receiving surface 22 directed in a direction opposite to the first light receiving surface 21. Each of the first light receiving surface 21 and the second light receiving surface 22 is formed smooth by a transparent protective material that seals the solar cell element. A generated output of the solar cells 20 is a sum of a generated output in the first light receiving surface 21 and a generated output in the second light receiving surface 22. Further, in the embodiment, when conversion efficiency of the first light receiving surface 21 is different from conversion efficiency of the second light receiving surface 22, the light receiving surface with high conversion efficiency is the first light receiving surface 21.

The solar cells 20 are disposed on the main body portion 11 of the wing 1. The solar cells 20 are disposed on the upper surface 4 of the wing 1 in a state in which the first light receiving surface 21 is directed above the horizontal direction. The solar cells 20 are disposed on only the flat portion 4a in the upper surface 4 of the wing 1. The solar cells 20 are disposed within a range from a position behind the front edge 2 of the wing 1 to a rear edge of the main body portion 11 of the wing 1 when seen in the upward/downward direction. Front edges of the solar cells 20 are disposed at intervals in the forward/rearward direction with respect to the front edge 2 of the wing 1 when seen in the upward/downward direction, and for example, extend parallel to the front edge 2 of the wing 1. The solar cells 20 are disposed in the upper portion of the wing 1 to be accommodated in a concave portion of the outer surface of the outer shell member 16. The first light receiving surface 21 of the solar cell 20 is disposed to be flush with the outer surface of the outer shell member 16 in surroundings of the solar cell 20.

The first light receiving surface 21 of the solar cell 20 constitutes at least a part of the flat portion 4a of the upper surface 4 of the wing 1.

The solar cells 20 are disposed to overlap the frame member 12 when seen in the upward/downward direction. The solar cells 20 overlap the spar 13 when seen in the upward/downward direction. The solar cells 20 are disposed between a pair of neighboring ribs 14 such that they do not to overlap the ribs 14 when seen in the upward/downward direction.

Figure 3:
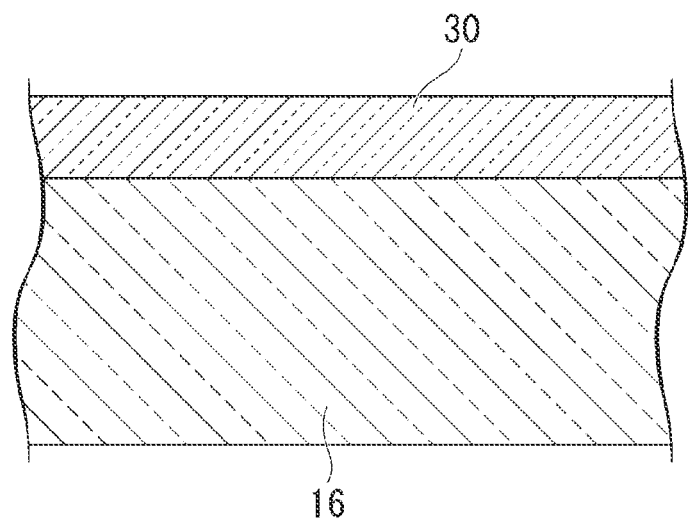
FIG. 3 is a cross-sectional view showing a light reflecting part according to the first embodiment.

FIG. 3 is a cross-sectional view showing the light reflecting part according to the first embodiment.

As shown in FIGS. 2 and 3, the light reflecting part 30 is provided on the main body portion 11 of the wing 1. The light reflecting part 30 is provided on the inner surface of the outer shell member 16. The light reflecting part 30 is disposed below at least a part of the solar cells 20. The light reflecting part 30 overlaps the inner surface of the outer shell member 16 where the outer surface is directed downward in the horizontal direction. That is, the light reflecting part 30 is provided on the inner surface of the outer shell member 16 in the lower portion of the wing 1. An inner surface of the light reflecting part 30 is directed upward in the horizontal direction. The light reflecting part 30 is disposed on at least a part of a region that does not overlap the solar cells 20 in front of the solar cells 20 when seen in the upward/downward direction. In the embodiment, the light reflecting part 30 is disposed on only the entire region that does not overlap the solar cells 20 in front of the solar cells 20 when seen in the upward/downward direction.

The light reflecting part 30 is formed such that a reflection factor of light incident from above is increased more than when the light reflecting part 30 is not provided on the inner surface of the outer shell member 16. In the embodiment, light reflecting part 30 is a transparent material having transmittance, and formed of a material with a higher refractive index than a material that forms the outer shell member 16. As a resin-based material that forms the light reflecting part 30, for example, it can be appropriately selected from poly-methyl methacrylate resin, fluorocarbon resin, fluorocarbon rubber, silicon rubber, polyvinyl fluoride, polyvinylidene fluoride resin, silicone resin, acrylic rubber, polypropylene, ethylene propylene rubber, urethane, acrylic resin, poly methyl methacrylate resin, urethane rubber, butyl rubber, natural rubber, nitrile rubber, polyethylene, polyamide resin, nylon, styrene butadiene rubber, vinyl chloride, chloroprene rubber, epoxy, phenol resin, polycarbonate, polystyrene, polyester resin, melamine resin, poly-methyl methacrylate resin, ebonite, or the like, according to the material of the outer shell member 16. As a metal-based material that forms the light reflecting part 30 such as a metal film, a metal oxide film, or the like, for example, it can be appropriately selected from indium, zinc, tin, titanium, gold, silver, platinum, copper, manganese, cobalt, nickel, tungsten, aluminum, molybdenum, vanadium, calcium, lithium, cesium, niobium, or the like, according to the material of the outer shell member 16. For example, the light reflecting part 30 is formed of a film attached to the inner surface of the outer shell member 16, a membrane laminated on the inner surface of the outer shell member 16, or the like. The inner surface of the light reflecting part 30 is formed smooth. The light reflecting part 30 specularly reflects the light incident from above.

Further, a thickness of the light reflecting part 30 may be set according to the wavelength for which the reflection factor is desired to be increased further, or may be set to the thickness that can minimize a decrease in strength of the wing 1. For example, when the strength of the wing 1 is secured by something other than the light reflecting part 30, the light reflecting part 30 may be formed in the form of a thin film. For example, when a portion of the outer shell member 16 on which the light reflecting part 30 is provided is formed thin locally, the light reflecting part 30 may be formed thick enough to compensate for the decrease in strength of the wing 1.

As described above, the flight vehicle P of the embodiment includes the main body portion 11 of the wing 1 formed by the outer shell member 16 having transmittance in a hollow shape, the double-side generation type solar cells 20 disposed on the upper surface 4 of the wing 1 in the main body portion 11 of the wing 1, and the light reflecting part 30 provided on the inner surface of the outer shell member 16. According to the configuration, light passing through the outer shell member 16 of the light incident on the wing 1 from below can be directed toward below the solar cells 20 and received by the second light receiving surface 22. Accordingly, in comparison with the configuration in which power is generated only by the light receiving surface where the solar cells face upward, electric power generation of the solar cells 20 can be improved. In addition, in comparison with the configuration in which the solar cells are disposed on each of the upper surface and the lower surface of the wing, an increase in weight can be minimized.

Figure 4:
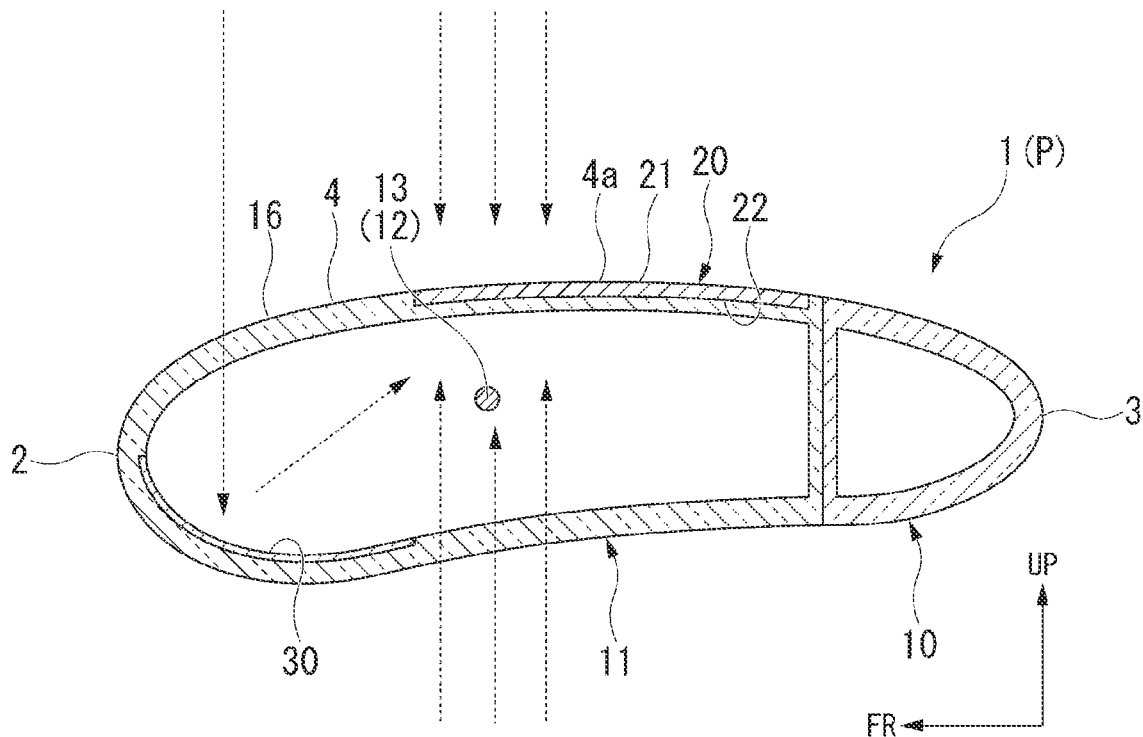
FIG. 4 is a view for describing an action of the flight vehicle according to the first embodiment.

Moreover, as shown in FIG. 4, the light passing through the outer shell member 16 around the solar cells 20 when seen from above of the light incident on the wing 1 from above can be reflected in the light reflecting part 30. Accordingly, in addition to the light incident on the wing 1 from below, the light incident on the wing 1 from above can also be incident on the second light receiving surfaces 22 of the solar cells 20. Accordingly, electric power generation of the solar cells 20 can be further improved.

In particular, in the embodiment, the spar 13 overlaps the solar cells 20 when seen in the upward/downward direction. For this reason, some of the light incident on the wing 1 from below is shielded by the spar 13, and the shadow of the spar 13 is formed on the second light receiving surfaces 22 of the solar cells 20. Accordingly, the electric power generation of the solar cells 20 is decreased in comparison with the case in which the shadow is not formed on the second light receiving surfaces 22 of the solar cells 20. Here, as described above, the light incident on the wing 1 from above is also incident on the second light receiving surfaces 22 of the solar cells 20 by the light reflecting part 30, and thus, a decrease in electric power generation of the solar cells 20 can be minimized.

In addition, the light reflecting part 30 is provided on the inner surface of the outer shell member 16. For this reason, in comparison with the configuration in which the light reflecting part 30 is provided from the inner surface to the outer surface of the main body portion 11 of the wing 1 to pass through the outer shell member, a decrease in transmittance can be minimized according to an increase in reflection factor on the outer surface of the main body portion 11 of the wing 1. Accordingly, the light incident on the wing 1 from below can be efficiently received by the second light receiving surfaces 22 of the solar cells 20.

Figure 5:
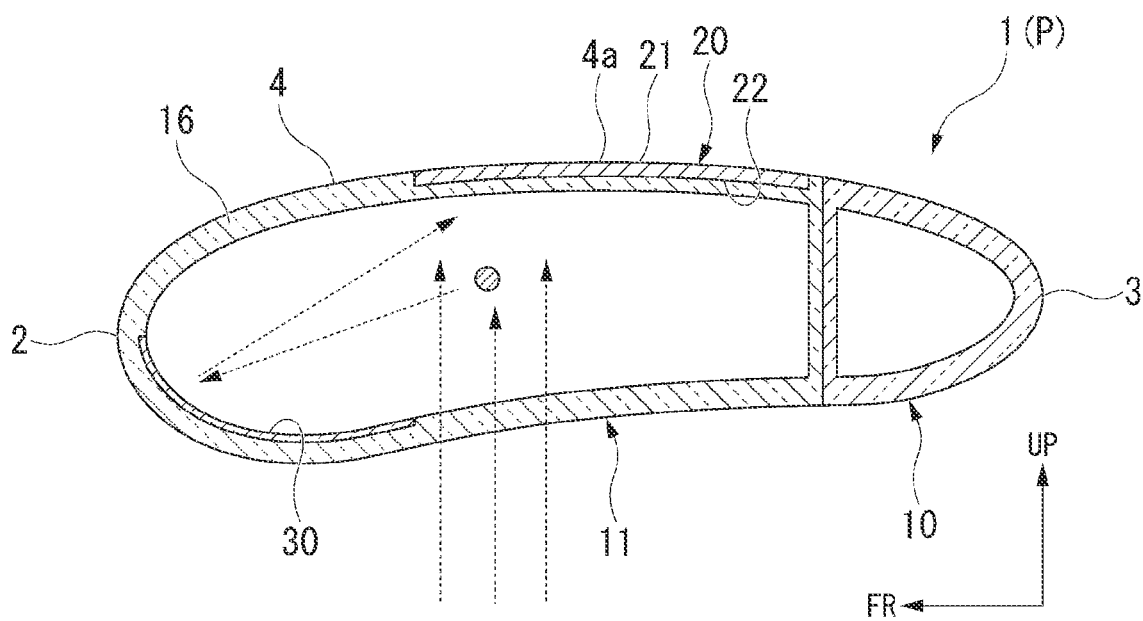
FIG. 5 is a view for describing an action of the flight vehicle according to the first embodiment.

In addition, as shown in FIG. 5, the light reflected by the frame member 12 in the main body portion 11 of the wing 1 is reflected by the light reflecting part 30, and thus, light can be trapped inside the main body portion 11 of the wing 1. Accordingly, the light receiving amount in the second light receiving surfaces 22 of the solar cells 20 can be increased. Accordingly, the electric power generation of the solar cells 20 can be improved.

In addition, the light reflecting part 30 is provided on the inner surface of the outer shell member 16 where the outer surface is directed toward below the horizontal direction. According to the configuration, since the inner surface of the light reflecting part 30 is directed above the horizontal direction, the light incident from above can be reflected above the horizontal direction. Accordingly, the light incident on the wing 1 from above can be efficiently incident on the second light receiving surfaces 22 of the solar cells 20.

In addition, the light reflecting part 30 is formed of a material having a higher refractive index than that of the outer shell member 16. According to the configuration, the reflection factor of the light in the surface of the light reflecting part 30 is higher than the reflection factor in the surface of the outer shell member 16. Accordingly, in comparison with the configuration in which the light reflecting part is not provided on the inner surface of the outer shell member 16, the reflection factor of the light incident from above can be increased. Accordingly, the light incident on the wing 1 from above can be efficiently incident on the second light receiving surfaces 22 of the solar cells 20.

Further, in the embodiment, the light reflecting part 30 can improve the electric power generation of the solar cells 20. Meanwhile, as the light reflecting part 30 is provided, the weight of the wing 1 may be increased according to the thickness of the light reflecting part 30. For this reason, the light reflecting part 30 is desirably formed such that an increasing rate of the electric power generation of the solar cells 20 is higher than the increasing rate of the weight of the wing 1 by providing the light reflecting part 30. Accordingly, it is possible to minimize deterioration of the performance of the flight vehicle P as an aircraft.

Second Embodiment

Figure 6:
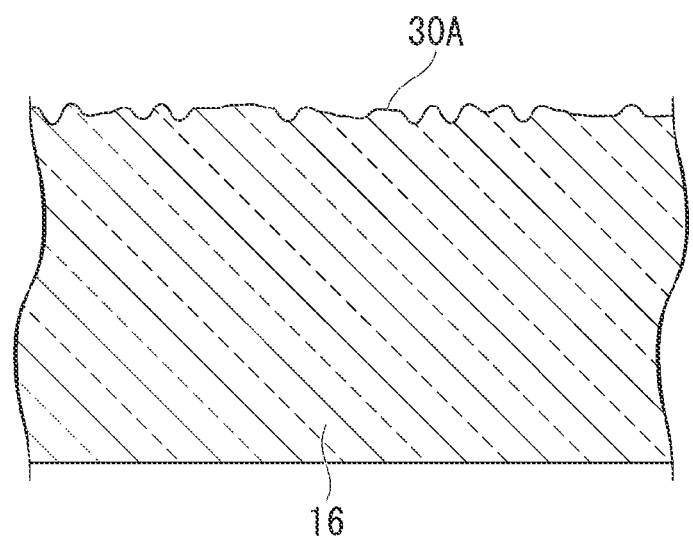
FIG. 6 is a cross-sectional view showing a light reflecting part according to a second embodiment.

FIG. 6 is a cross-sectional view showing a light reflecting part according to a second embodiment.

In the first embodiment shown in FIG. 2, the light reflecting part 30 specularly reflects the light incident from above. On the other hand, in the second embodiment shown in FIG. 6, a light reflecting part 30A is distinguished from the first embodiment in that light incident from above is diffusively reflected. Further, the configuration other than the following description is the same as in the first embodiment.

As shown in FIG. 6, the light reflecting part 30A is formed on the inner surface of the outer shell member 16. Specifically, the light reflecting part 30A is formed through rough surface processing of the inner surface of the outer shell member 16. The surface roughness of the light reflecting part 30A is greater than the surface roughness of the outer surface of the outer shell member 16. The light reflecting part 30A is formed such that the reflection factor of the light incident from above is higher than that when the light reflecting part is not provided on the inner surface of the outer shell member 16.

According to the configuration, the light passing through the outer shell member 16 around the solar cells 20 when seen from above of the light incident on the wing 1 from below can be diffusively reflected in the light reflecting part 30A. For this reason, some of the light that is diffusively reflected is incident on the second light receiving surfaces 22 of the solar cells 20. Accordingly, the same effects as in the first embodiment can be exhibited.

Third Embodiment

Figure 7:
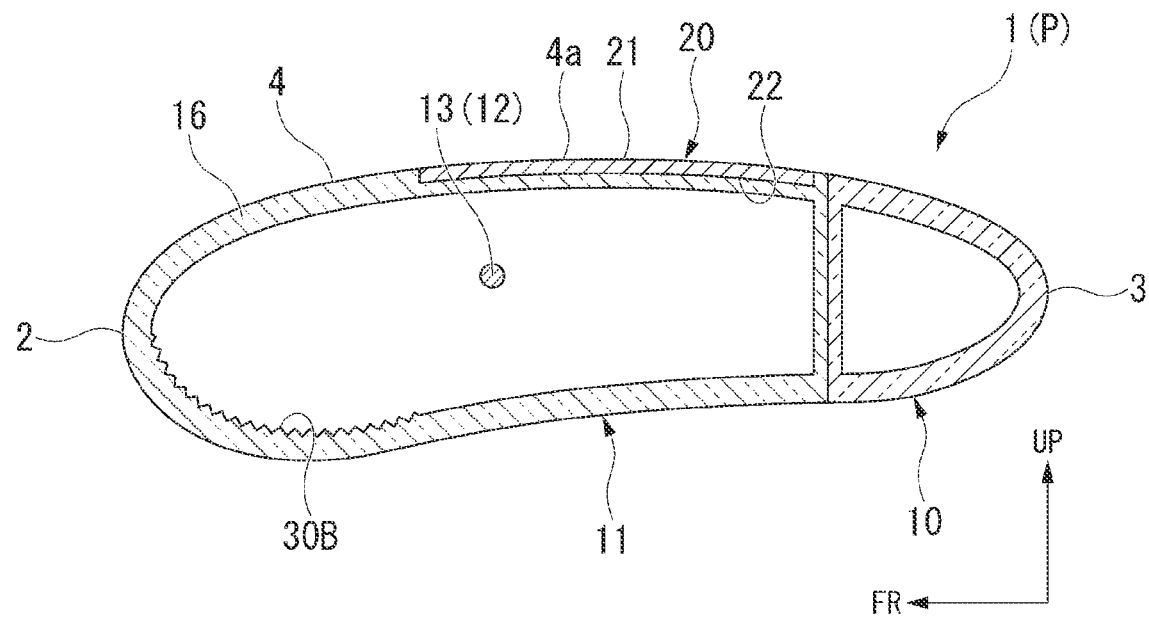
FIG. 7 is a cross-sectional view of a wing of a flight vehicle according to a third embodiment, corresponding to FIG. 2.

FIG. 7 is a cross-sectional view of a wing of a flight vehicle according to a third embodiment, corresponding to FIG. 2.

In the first embodiment shown in FIG. 2, the light reflecting part 30 specularly reflects the light incident from above. On the other hand, in the third embodiment shown in FIG. 7, a light reflecting part 30B is distinguished from the first embodiment in that the light incident from above is diffusively reflected. Further, the configuration other than the following description is the same as in the first embodiment.

As shown in FIG. 7, the light reflecting part 30B is provided on the inner surface of the outer shell member 16. The light reflecting part 30B has a texture that diffusively reflects light. The texture is, for example, a macro concavo-convex structure. The light reflecting part 30B may overlap the inner surface of the outer shell member 16 formed as a separate member from the outer shell member 16, or may be directly processed on the inner surface of the outer shell member 16. The light reflecting part 30B is formed such that the reflection factor of the light incident from above is higher than that when the light reflecting part is not provided on the inner surface of the outer shell member 16.

According to the configuration, the light passing through the outer shell member 16 around the solar cells 20 when seen from above of the light incident on the wing 1 from below can be diffusively reflected in the light reflecting part 30B. For this reason, some of the light that is diffusively reflected is incident on the second light receiving surfaces 22 of the solar cells 20. Accordingly, the same effects as in the first embodiment can be exhibited.

Further, while the wing 1 is the main wing of the flight vehicle P in the embodiment, there is no limitation thereto. For example, the configuration of the embodiment may be combined with a horizontal stabilizer of the flight vehicle.

In addition, while one spar 13 is provided on the frame member 12 of the wing 1 in the embodiment, a plurality of spars may be provided. In this case, the plurality of spars are disposed to extend at intervals.

In addition, the configuration of the light reflecting part is not limited to the above-mentioned embodiment. For example, the light reflecting part is formed of a metal film or the like, and may be configured to totally reflect the light incident from above. However, the configuration in which the light reflecting part itself also has transmittance like the embodiment is more preferable in that the light incident on the wing from below can be transmitted through the light reflecting part and incident on the second light receiving surface of the solar cell.

In addition, while the solar cells 20 overlap the spar 13 of the frame member 12 when seen in the upward/downward direction in the embodiment, the solar cells 20 may overlap the ribs 14. In addition, the solar cells may not overlap the frame member 12 when seen in the upward/downward direction. Even in this case, the above-mentioned effects can be exhibited.

In addition, in the embodiment, the light reflecting part 30, 30A or 30B is disposed in only the entire region that does not overlap the solar cells 20 in front of the solar cells 20 when seen in the upward/downward direction. However, the region in which the light reflecting part is disposed is not limited thereto. The light reflecting part may be disposed behind the solar cells 20 when seen in the upward/downward direction. In addition, the light reflecting part may be disposed from the region that does not overlap the solar cells 20 to the region that overlap the solar cells 20 when seen in the upward/downward direction.

According to at least one of the embodiments described above, the flight vehicle has a wing formed by an outer shell member with transmittance in a hollow shape, the double-side generation type solar cells disposed on the upper surface of the wing, and the light reflecting part provided on the inner surface of the outer shell member. According to the configuration, the light incident on the wing from above can be reflected in the light reflecting part. Accordingly, in addition to the light incident on the wing from below, the light incident on the wing from above can also be reflected by the second light receiving surfaces of the solar cells. Accordingly, the electric power generation of the solar cells can be improved while minimizing an increase in weight.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flight vehicle comprising:
   a wing having an outer shell member that transmits light and is formed in a hollow shape by the outer shell member;
   double-side generation type solar cells disposed on an upper surface of the wing; and
   a light reflecting part provided on an inner surface of the outer shell member,
      wherein the light reflecting part is provided on a part of of the wing located below the wing chord, and
      light incident from the lower surface of the wing through the outer shell member on the lower surface of the wing in which the light reflecting part is not provided is incident on lower surfaces of the solar cells.

2. The flight vehicle according to claim 1, wherein a spar of the wing is provided in the wing.

3. The flight vehicle according to claim 2, wherein the light reflecting part is formed of a material having a higher refractive index than that of the outer shell member.

4. The flight vehicle according to claim 2, wherein a surface roughness of the light reflecting part is greater than a surface roughness of the outer surface of the outer shell member.

5. The flight vehicle according to claim 2, wherein the light reflecting part has a texture that diffusively reflects light.

6. The flight vehicle according to claim 1, wherein the light reflecting part is formed of a material having a higher refractive index than that of the outer shell member.

7. The flight vehicle according to claim 1, wherein a surface roughness of the light reflecting part is greater than a surface roughness of an outer surface of the outer shell member.

8. The flight vehicle according to claim 1, wherein the light reflecting part has a texture that diffusively reflects light.

9. The flight vehicle according to claim 1, wherein the light reflecting part is provided on a region that does not overlap the solar cells when seen in the upward/downward direction of the wing.

10. The flight vehicle according to claim 1, wherein the light reflecting part is formed such that a reflection factor of light incident from above is increased more than when the light reflecting part is not provided on the inner surface of the outer shell member.

11. The flight vehicle according to claim 1, wherein the light reflecting part is provided on a region that does not overlap the solar cells when seen in the upward/downward direction of the wing, and is formed such that a reflection factor of light incident from above is increased more than when the light reflecting part is not provided on the inner surface of the outer shell member.

* * * * *